(12) United States Patent
Lin et al.

(10) Patent No.: US 6,621,129 B1
(45) Date of Patent: Sep. 16, 2003

(54) MROM MEMORY CELL STRUCTURE FOR STORING MULTI LEVEL BIT INFORMATION

(75) Inventors: Chun-Jung Lin, Hsin-Chu (TW); Ful-Long Ni, Hsin-Chu (TW); Chang-Ju Chen, Hsin-Chu (TW)

(73) Assignee: Macronix International Co., Ltd., Taiwan (TW)

( * ) Notice: Subject to any disclaimer, the term of this patent is extended or adjusted under 35 U.S.C. 154(b) by 0 days.

(21) Appl. No.: 10/153,892

(22) Filed: May 24, 2002

(51) Int. Cl.[7] .............................................. H01L 31/119
(52) U.S. Cl. .................. 257/390; 257/391; 257/392; 257/396; 257/903; 257/905
(58) Field of Search ................... 257/390, 391, 257/392, 396, 27.091 E, 27.102 E, 27.107 E, 903, 905

(56) References Cited

U.S. PATENT DOCUMENTS

| | | | | |
|---|---|---|---|---|
| 4,864,374 A | * | 9/1989 | Banerjee | 247/68 |
| 4,999,811 A | * | 3/1991 | Banerjee | 365/149 |
| 5,016,071 A | * | 5/1991 | Kumagai et al. | 257/303 |
| 5,710,072 A | * | 1/1998 | Krauntchneider et al. | 438/197 |
| 6,110,773 A | * | 8/2000 | Lee | 438/238 |

* cited by examiner

Primary Examiner—Jasmine J B Clark

(57) ABSTRACT

A MROM memory cell structure for storing multi level bit information is disclosed. First of all, a substrate is provided. The substrate has first and second trenches therein, wherein the first trench is deeper than second trench. A conformnal dielectric layer formed on sidewall and bottom of the first and second trenches. A conductive layer filled in the first and second trenches and on the substrate. A first doped region is formed under the first trench. A second doped region is formed under the second trench. A third doped region is formed in surface of the substrate and between the first and second trenches.

18 Claims, 4 Drawing Sheets

MROM MEMORY CELL STRUCTURE FOR STORING MULTI LEVEL BIT INFORMATION

BACKGROUND OF THE INVENTION

1. Field of the Invention

The present invention generally relates to memory devices, and more particularly to a MROM memory cell structure for storing multi level bit information.

2. Description of the Prior Art

There are several read-only memory (ROM) cell structures are well known in application. One approach is referred to as the flat-type ROM design. With the requirement of better memory cell efficiency, the cell pitch and bank height become the key factor to be considered. While the memory cell is shrinking down, the contact size and metal pitch become the limit of it. On the other hand, memory array used to use LOCOS-type MOS for the bank selection transistors, which causes difficulties in the reduction of the layout area.

In general, read-only-memories (hereinafter referred to as ROMS) are used for storing data information in a permanent, non-volatile form. Semiconductor ROMs find particular application in digital electronic equipment such as computers, office equipment, and game machines where they are used to store permanent data information. Such permanent data information includes control microprograms, electronic games, printer fonts, etc. With the continuing advances in digital electronics and the corresponding need for larger quantities of data information, the demand for cheaper and higher capacity ROMs is growing.

Semiconductor ROMs generally store their data information in arrays of memory cells, wherein each memory cell is a single transistor. The data bits held by the memory cell transistors are permanently stored in the physical or electrical properties of the individual memory cell transistors. For example, in a typical ROM wherein the memory cell transistors are MOSFETs (metal-oxide-semiconductor field effect transistors), memory cell transistors having a first threshold voltage store data bits of value "0" whereas memory cell transistors having a second threshold voltage different from the first threshold voltage store data bits of value "1".

Semiconductor ROMs are generally formed by intersecting a plurality of bit lines, which have been diffused into a semiconductor substrate with a plurality of word lines lying over the substrate. The word lines are physically separated from the bit lines and the substrate by a thin gate oxide layer such that an array of memory cell MOSFET transistors is formed. In the array, the word lines serve as gates for the memory cell transistors while the bit lines serve as source and drain diffusion regions. Then, by properly adjusting the dopant concentrations of the channel regions of the individual memory cell transistors, the memory cell transistors are programmed to exhibit the threshold voltages corresponding to the data bits they store. In the case of mask-programmable read-only-memories (or, alternatively, mask ROMs or simply MROMs), the coding of the data bits onto the memory cell transistors is generally performed by implanting ions into the channel regions of the appropriate memory cell transistors, thereby adjusting their threshold voltages.

FIG. 1 illustrates a top view of the prior art of a semiconductor substrate under fabrication as a MROM memory device. The top view comprises a polysilicon layer 100, a source region 102, a drain region 104, and a transistor 106, wherein the transistor 106 is formed between the source region 102 and the drain region 104. The transistor 106 serves as mask-read-only-memory cell. The transistor 106 is only used two types as "0" and "1". The process window is too small and the channel length is the same in the conventional of MROM structure. The conventional of MROM structure for storing data states only have "0" and "1" types by applying a different voltage.

For the forgoing reasons, there is a necessity for a structure of a MROM memory cell structure for storing multi level bit information.

SUMMARY OF THE INVENTION

In accordance with the present invention is provided a MROM memory cell structure for storing multi level bit information that the invention is to form different channel length under the substrate of MROM by using at least two different photolithography steps. This invention transistor area is as same as conventional transistor area but memory array is more than conventional transistor. The process window is better than conventional transistor because this inventive structure is formed under the substrate.

In accordance with the present invention is provided a MROM memory cell structure for storing multi level bit information that the structure is formed under the substrate and the surface of transistors is flat so as to increase process window.

One object of the present invention is to provide a MROM memory cell structure for storing multi level bit information that the surface area of transistors is reduced so as to increase memory capacitance of memory array.

Another object of the present invention is to provide a MROM memory cell structure for storing multi level bit information that the different channel lengths are formed by using different trench depth.

Further another object of the present invention is to provide a MROM memory cell structure for storing multi level bit information that the data states more than "0" and "1" can be stored by using different channel lengths.

In order to achieve the above objects, the present invention is to provide a MROM memory cell structure for storing multi level bit information. First of all, a substrate is provided. The substrate has first and second trenches therein, wherein the first trench is deeper than second trench. A conformal dielectric layer formed on sidewall and bottom of the first and second trenches. A conductive layer filled in the first and second trenches and on the substrate. A first doped region is formed under the first trench. A second doped region is formed under the second trench. A third doped region is formed in surface of the substrate and between the first and second trenches.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

The present invention is to provide a MROM memory cell structure for storing multi level bit information. First of all, a substrate is provided. The substrate has first and second trenches therein, wherein the first trench is deeper than second trench. A conformal dielectric layer formed on sidewall and bottom of the first and second trenches and on the substrate. A conductive layer filled in the first and second trenches. A first doped region is formed under the first trench. A second doped region is formed under the second trench. A third doped region is formed in surface of the substrate and between the first and second trenches.

However, the invention is to form different channel length under substrate of MROM by using at least two different photolithography steps. This invention transistor area is as same as conventional transistor area but memory array is more than conventional transistor. The process window is better than conventional transistor because this inventive structure is formed under the substrate.

This invention discloses a substrate has two trenches with different depth. A conformal dielectric layer is formed on sidewall and bottom of the two trenches and on the substrate. Then, a conductive layer is filled in the two trenches. The first and second doped regions are under the two trenches respectively, and a third doped region is in surface of the substrate and between the two trenches. The dielectric layer is used as gate dielectric and the conductive layer is gate electrode. The first and second doped regions are used as source regions and the third doped region is drain region. The different depth of the two trenches is used as different channel length.

The embodiment of the present invention is depicted in the FIGS. 2A–2D, which show a cross-section of the MROM memory cell structure for storing multi level bit information in accordance with preferred embodiment of the present invention.

Figure 3:
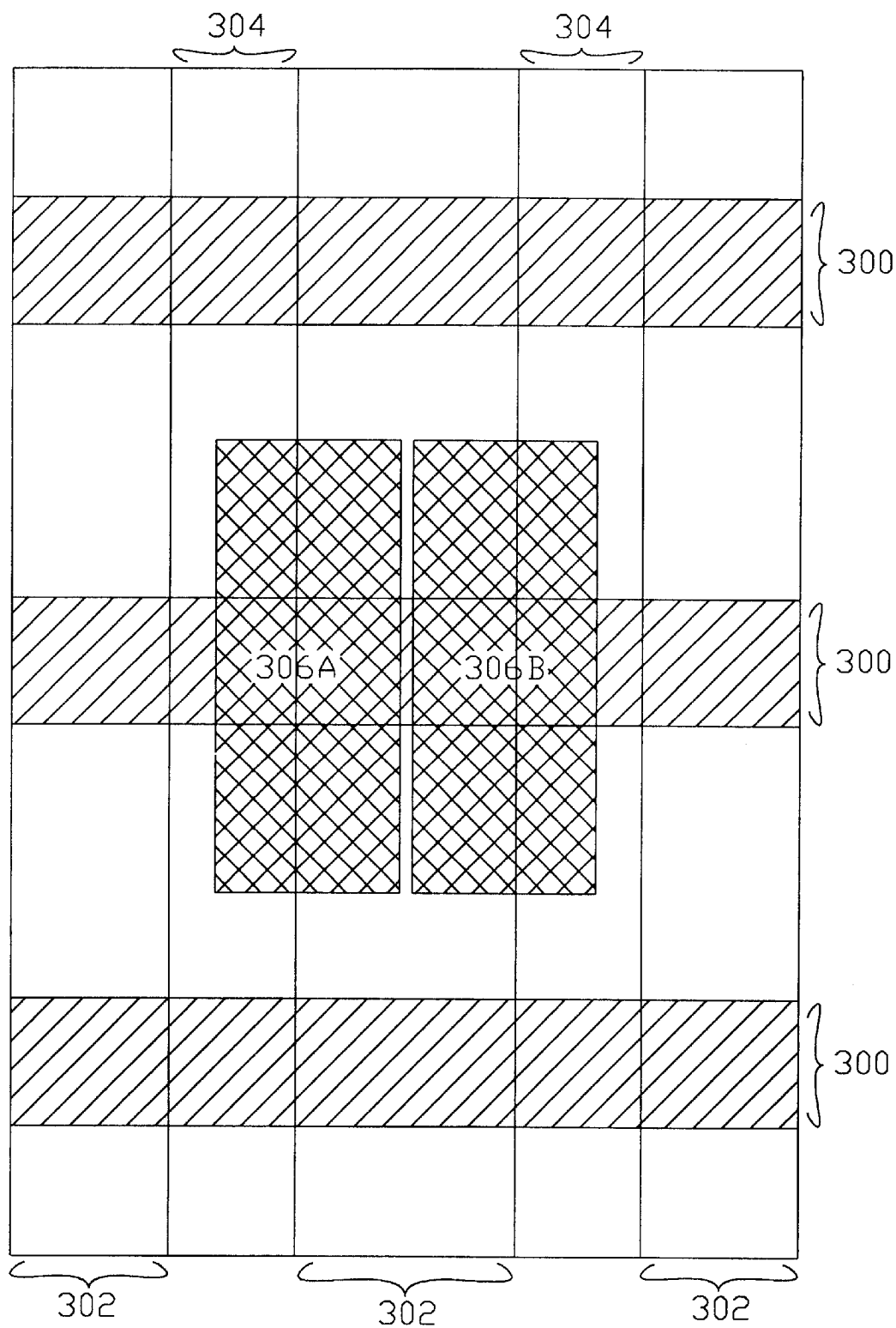
FIG. 3 illustrates a top view of the present invention of a semiconductor substrate under fabrication as a MROM memory device.

FIG. 3 illustrates a top view of the present invention of a semiconductor substrate under fabrication as a MROM memory device.

Figure 1:
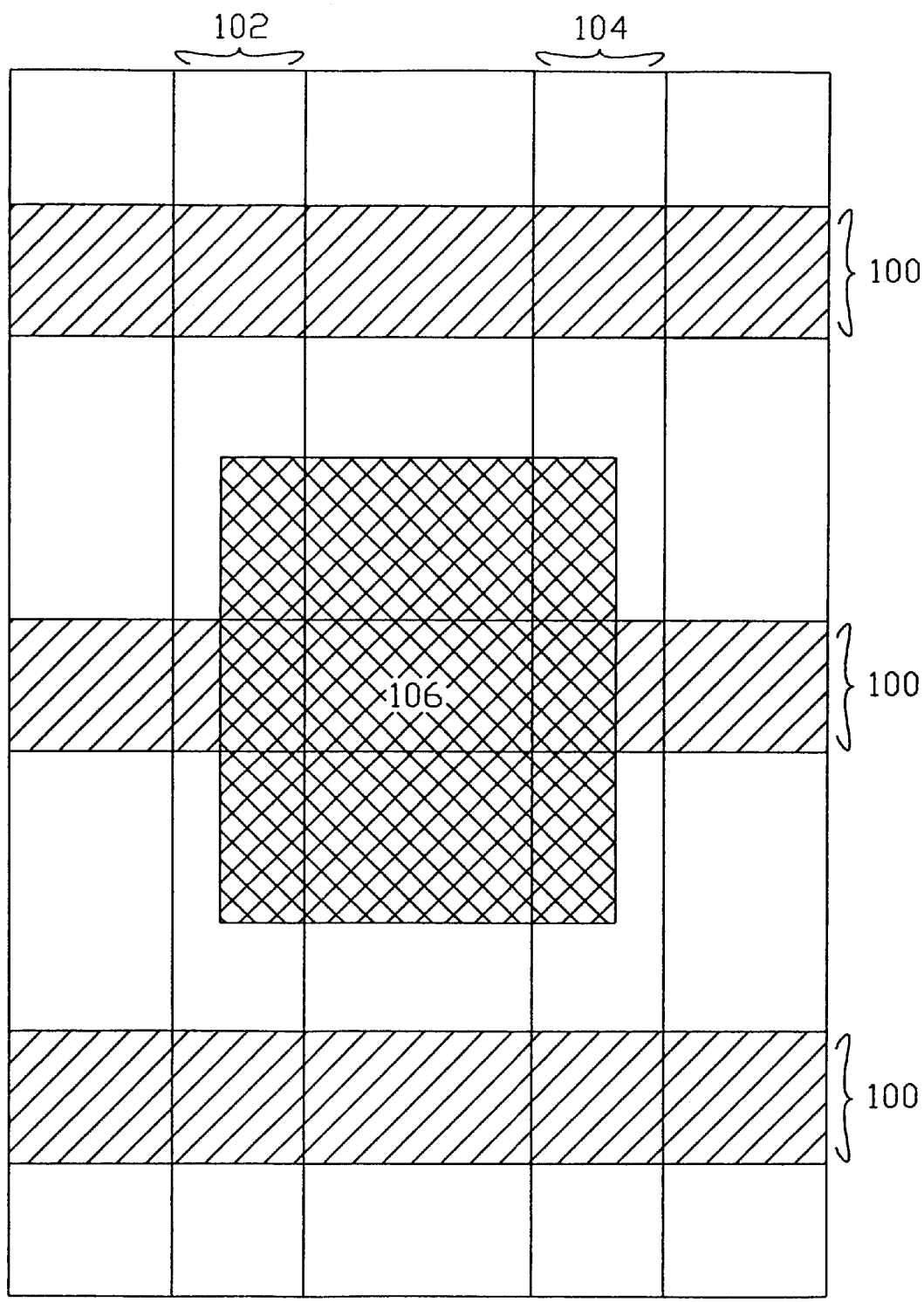
FIG. 1 illustrates a top view of the prior art of a semiconductor substrate under fabrication as a MROM memory device.
Figure 2A:
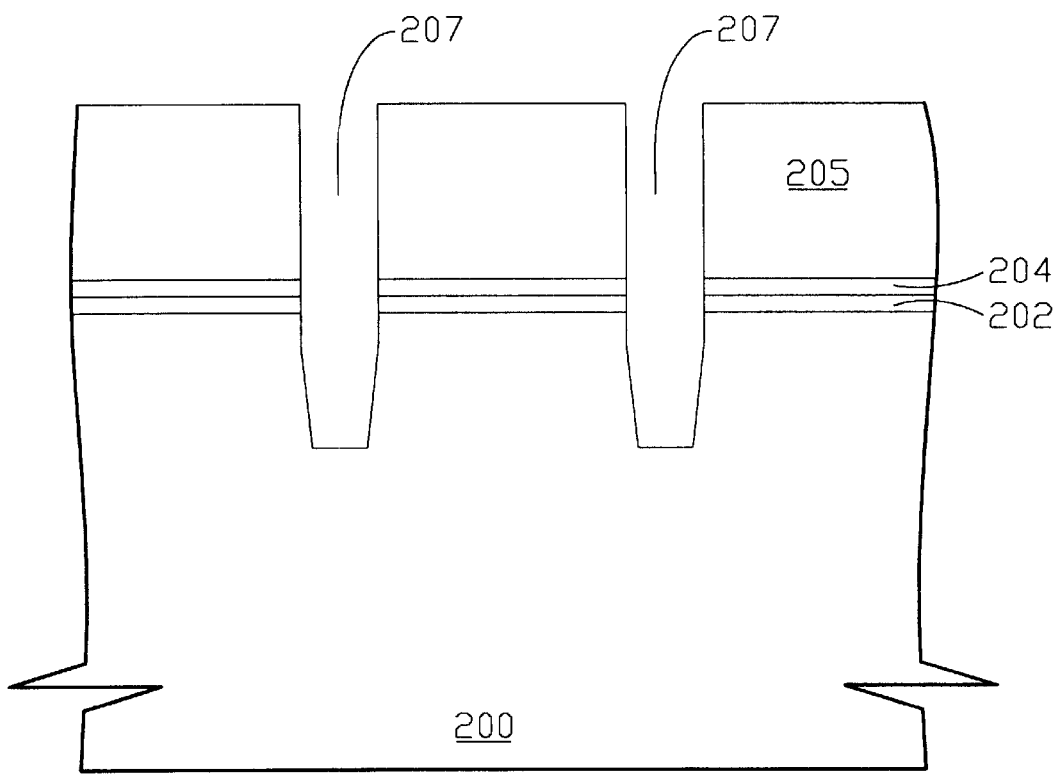
FIGS. 2A–2D are cross-sectional schematic diagrams illustrating the MROM memory cell structure for storing multi level bit information in accordance with preferred embodiment of the present invention.

Referring to FIG. 2A, a substrate 200 is provided. Then, a pad oxide layer 202 is formed on the substrate 200. Next, a dielectric layer 204 is deposited on the pad oxide layer 202. The dielectric layer 204 comprises silicon nitride. The dielectric layer 204 is deposited by using a chemical vapor deposition (CVD), low pressure chemical vapor deposition (LPCVD), or plasma enhance chemical vapor deposition (PECVD) method. Then, a first patterned photoresist layer 205 is formed as a first mask over the dielectric layer 204 to form trenches 207 in the substrate 200 by etching. The depth of the trenches 207 is between about 2000 angstroms and 6000 angstroms. In the embodiment, depth of these trenches 207 is preferable about 3500 angstroms.

Figure 2B:
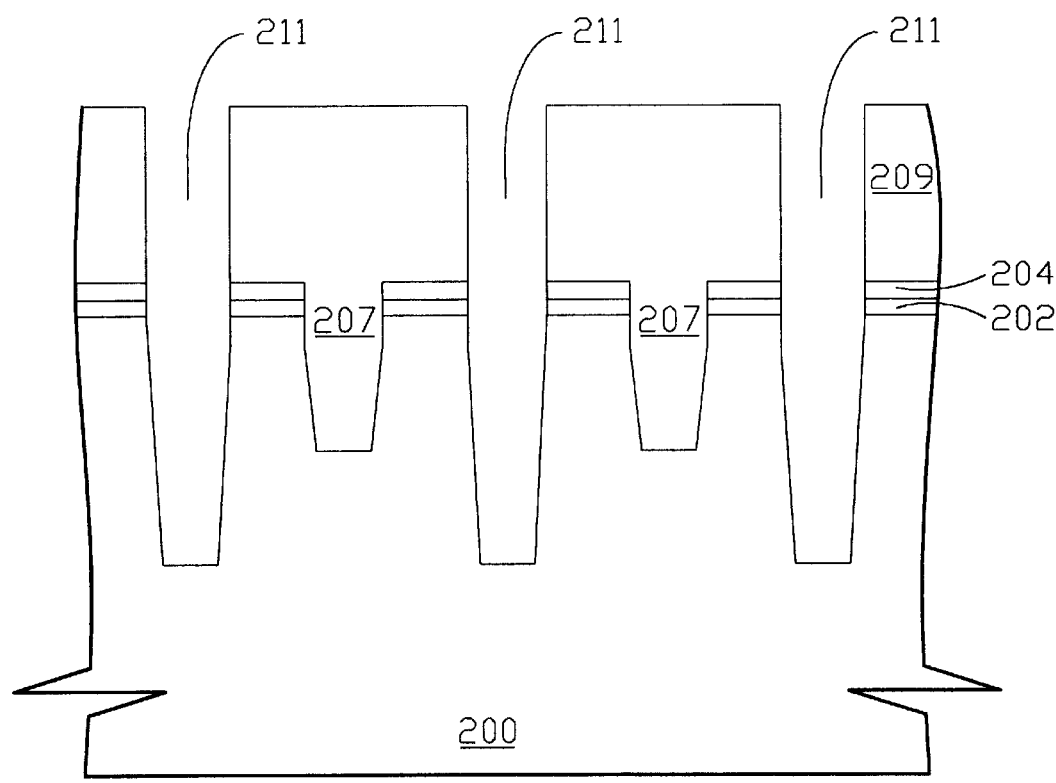

Referring to FIG. 2B, a first photoresist layer 205 is removed.

Then, a second patterned photoresist layer 209 is formed as a second mask over the dielectric layer 204 to form trenches 211 in the substrate 200 by etching. The depth of the trenches 211 is between about 3000 angstroms and 8000 angstroms. In the embodiment, depth of these trenches 211 is preferable about 5000 angstroms. The depth of the trench 211 is larger than the trench 207.

Figure 2C:
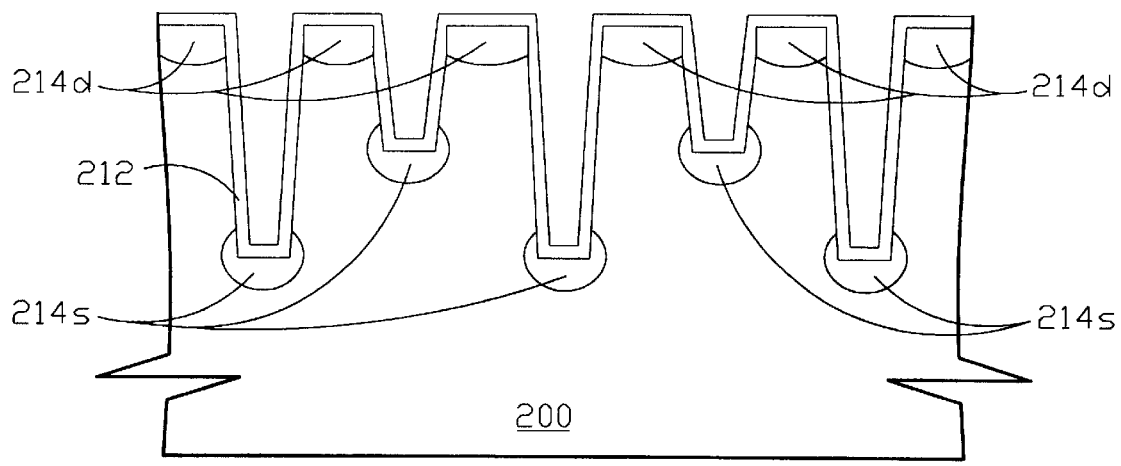

Referring to FIG. 2C, the second photoresist layer 209, the dielectric layer 204, and the pad oxide layer 202 are respectively removed. Then, a conformal dielectric layer 212 is formed on sidewall and bottom of the trenches 207 and 211 and on the substrate 200. Next, ions are implanted into the substrate 200 to form source region 214s and drain region 214d.

Figure 2D:
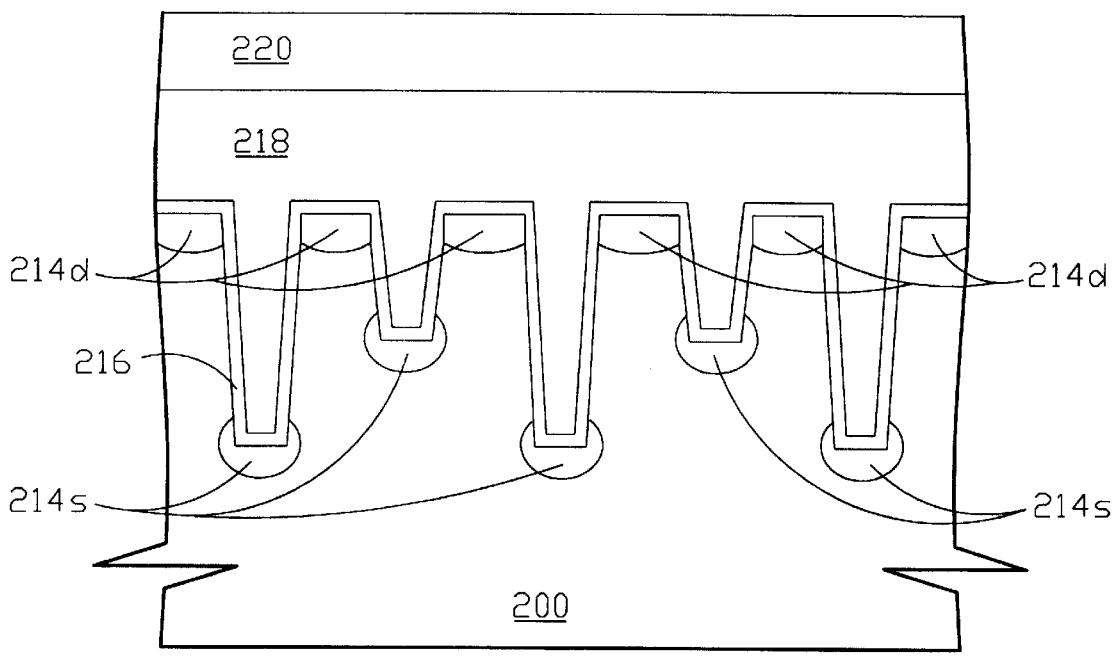

Referring to FIG. 2D, a conformal dielectric layer 212 is stripped. Then, a gate oxide layer 216 is formed on sidewall and bottom of the trenches 207, 211 and on the substrate 200. Next, a gate polysilicon layer 218 is deposited on the gate oxide layer 216. Then, the metal silicide layer 220 is formed on the gate polysilicon layer 218. The metal silicide layer 220 comprises $WSi_x$.

FIG. 3 illustrates a top view of the present invention of a semiconductor substrate under fabrication as a MROM memory device. The top view comprises a polysilicon layer 300, a source region 304, a drain region 302, a first transistor 306A, and a second transistor 306B, wherein the first transistor 306A and the second transistor 306B are formed between the source region 304 and the drain region 302 respectively. The first transistor 306A and the second transistor 306B are formed by using two masks step method to generate the different trench depths such as the different channel lengths. For example, the channel length A and the channel length B are to combined (0, 0), (0, 1), (1, 0), and (1, 1) four types. The first transistor 306A and the second transistor 306B can use at the same time and can use only one transistor (the first transistor 306A or the second transistor 306B) alone. The area of the first transistor 306A plus the second transistor 306B is the same as the area of the conventional transistor. This invention transistor can store data bigger than conventional transistor. The invention of MROM structure is formed under the substrate. The process window is too small and the surface of transistor is flat so as to increase window.

This invention is provided a MROM memory cell structure for storing multi level bit information. This structure is formed under the substrate. The surface of transistor is flat so as to increase process window. The surface area of transistor is reduced so as to increase memory capacitance of memory array. The different channel lengths are formed by using a different trench depth. Data states more than "0" and "1" can be stored by using a different channel lengths.

While this invention has been described with reference to illustrative embodiments, this description is not intended or to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A cell having two transistors of different channel length in a memory array, comprising:
   a substrate having first and second trenches therein, wherein said first trench is deeper than second trench;
   a conformal dielectric layer on sidewall and bottom of said first and second trenches and on the substrate;
   a conductive layer filled in said of first and second trenches;
   a first doped region is located under said first trench;
   a second doped region is located under said second trench; and
   a third doped region is located in surface of said substrate and between said first and second trenches.

2. The cell having two transistors of different channel length in a memory array of claim 1, wherein said memory is mask read only memory (MROM) cell.

3. The cell having two transistors of different channel length in a memory array of claim 1, wherein the area of said two transistors is the same as the area of conventional single transistor.

4. The cell having two transistors of different channel length in a memory array of claim 1, wherein said conformal dielectric layer is used as gate dielectric.

5. The cell having two transistors of different channel length in a memory array of claim 1, wherein said conductive layer is used as gate electrode.

6. The cell having two transistors of different channel length in a memory array of claim 1, wherein said first doped region is source region.

7. The cell having two transistors of different channel length in a memory array of claim 1, wherein said second doped region is source region.

8. The cell having two transistors of different channel length in a memory array of claim 1, wherein said third doped region is drain region.

9. A cell having two transistors of different channel length in a memory array, comprising:
   a substrate having first and second trenches therein, wherein said first trench is deeper than second trench;
   a conformal dielectric layer is used as gate dielectric on sidewall and bottom of said first and second trenches and on the substrate;
   a first conductive layer is used as gate electrode filled in said of first and second trenches;
   a first doped region is located under said first trench;
   a second doped region is located under said second trench; and
   a third doped region is located in surface of said substrate and between said first and second trenches;
   a second conductive layer is on said first conductive layer.

10. The cell having two transistors of different channel length in a memory array of claim 9, wherein said memory is mask read only memory (MROM) cell.

11. The cell having two transistors of different channel length in a memory array of claim 9, wherein the area of said two transistors is the same as the area of conventional single transistor.

12. The cell having two transistors of different channel length in a memory array of claim 9, wherein said first doped region is source region.

13. The cell having two transistors of different channel length in a memory array of claim 9, wherein said second doped region is source region.

14. The cell having two transistors of different channel length in a memory array of claim 9, wherein said third doped region is drain region.

15. The cell having two transistors of different channel length in a memory array of claim 9, wherein said second conductive layer comprises $WSi_x$.

16. A cell having two transistors of different channel length in a MROM memory array, comprising:
   a substrate having first and second trenches therein, wherein said first trench is deeper than second trench;
   a conformal dielectric layer is used as gate dielectric on sidewall and bottom of said first and second trenches and on the substrate;
   a first conductive layer is used as gate electrode filled in said of first and second trenches;
   a first source region is located under said first trench;
   a second source region is located under said second trench;
   a drain region is located in surface of said substrate and between said first and second trenches; and
   a second conductive layer is on said first conductive layer.

17. The cell having two transistors of different channel length in a MROM memory array of claim 16, wherein said the area of said two transistors is the same as the area of conventional single transistor.

18. The cell having two transistors of different channel length in a MROM memory array of claim 16, wherein said second conductive layer comprises $WSi_x$.

* * * * *